US011073731B2

(12) United States Patent
Um et al.

(10) Patent No.: US 11,073,731 B2
(45) Date of Patent: Jul. 27, 2021

(54) ARRAY SUBSTRATE, DISPLAY PANEL AND DISPLAY DEVICE

(71) Applicant: BOE TECHNOLOGY GROUP CO., LTD., Beijing (CN)

(72) Inventors: Yoon Sung Um, Beijing (CN); Shunhang Zhang, Beijing (CN); Yun Sik Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 407 days.

(21) Appl. No.: 16/062,834

(22) PCT Filed: Nov. 2, 2017

(86) PCT No.: PCT/CN2017/109130
§ 371 (c)(1),
(2) Date: Jun. 15, 2018

(87) PCT Pub. No.: WO2018/171203
PCT Pub. Date: Sep. 27, 2018

(65) Prior Publication Data
US 2020/0272005 A1  Aug. 27, 2020

(30) Foreign Application Priority Data
Mar. 21, 2017 (CN) .......................... 201710170493.7

(51) Int. Cl.
*G02F 1/1362* (2006.01)
*G02F 1/1368* (2006.01)
(Continued)

(52) U.S. Cl.
CPC ...... *G02F 1/136286* (2013.01); *G02F 1/1368* (2013.01); *G02F 1/13624* (2013.01);
(Continued)

(58) Field of Classification Search
CPC .......................... H01L 27/124; G02F 1/136286
See application file for complete search history.

(56) References Cited

U.S. PATENT DOCUMENTS 5,032,008 A * 7/1991 Yamamoto .......... G02F 1/13363
349/119
9,430,975 B2 * 8/2016 Yao ...................... G09G 3/3696
(Continued)

FOREIGN PATENT DOCUMENTS

CN        101109875 A     1/2008
CN        102662286 A     9/2012
(Continued)

OTHER PUBLICATIONS

European Search Report in European Patent Application No. 17902216.5 dated Aug. 20, 2020.
(Continued)

*Primary Examiner* — Victoria K. Hall
(74) *Attorney, Agent, or Firm* — Collard & Roe, P.C.

(57) ABSTRACT

An array substrate, a display panel and a display device are disclosed. The array substrate includes a first data line and a second data line which extend substantially along a first direction and are adjacent to each other, a first gate line and a second gate line that extend substantially along a second direction intersected with the first direction and are adjacent to each other, and at least two sub-pixels which are sequentially arranged in parallel along the first direction; the first gate line and the second gate line are disposed at two sides of the at least two sub-pixels in the first direction, respectively.

14 Claims, 2 Drawing Sheets

US 11,073,731 B2
Page 2

(51) Int. Cl.
  *G02F 1/1343* (2006.01)
  *G02F 1/1337* (2006.01)
  *H01L 27/12* (2006.01)
  *H01L 27/112* (2006.01)

(52) U.S. Cl.
  CPC .. *G02F 1/133784* (2013.01); *G02F 1/134309* (2013.01); *G02F 1/136209* (2013.01); *H01L 27/1124* (2013.01); *G02F 1/134345* (2021.01); *G02F 2201/121* (2013.01)

(56) References Cited

U.S. PATENT DOCUMENTS

| | | | | |
|---|---|---|---|---|
| 9,704,889 B2* | 7/2017 | Kim | | H01L 27/1255 |
| 9,857,649 B2* | 1/2018 | Kim | | G02F 1/13624 |
| 9,933,678 B1* | 4/2018 | Chen | | G02F 1/1362 |
| 10,204,929 B2* | 2/2019 | Cheng | | H01L 27/124 |
| 10,365,528 B2* | 7/2019 | Um | | H01L 27/124 |
| 10,698,282 B2* | 6/2020 | Dai | | G02F 1/134363 |
| 10,802,351 B2* | 10/2020 | Hao | | G02F 1/136213 |
| 2005/0099378 A1* | 5/2005 | Kim | | G02F 1/134309 345/99 |
| 2007/0103615 A1* | 5/2007 | Cheng | | G02F 1/1368 349/43 |
| 2007/0109482 A1* | 5/2007 | Kim | | G02F 1/1393 349/144 |
| 2008/0284929 A1* | 11/2008 | Kimura | | G02F 1/13624 349/38 |
| 2009/0295693 A1* | 12/2009 | Yeom | | G09G 3/3648 345/88 |
| 2010/0157185 A1* | 6/2010 | Kim | | G09G 3/3659 349/38 |
| 2011/0096259 A1* | 4/2011 | Lee | | H01L 27/124 349/41 |
| 2012/0033149 A1* | 2/2012 | Song | | G02F 1/136286 349/42 |
| 2012/0235174 A1* | 9/2012 | Yu | | G02F 1/134363 257/88 |
| 2013/0215341 A1* | 8/2013 | Rho | | G02F 1/134309 349/15 |
| 2014/0035968 A1* | 2/2014 | Chen | | G09G 3/003 345/691 |
| 2014/0118652 A1* | 5/2014 | Zhang | | G02F 1/13624 349/43 |
| 2014/0210876 A1* | 7/2014 | Xie | | G09G 3/3233 345/694 |
| 2014/0217411 A1* | 8/2014 | Jiang | | G02F 1/136286 257/59 |
| 2014/0340622 A1* | 11/2014 | Ono | | G02F 1/136227 349/138 |
| 2015/0070635 A1* | 3/2015 | Woo | | G02F 1/13394 349/106 |
| 2015/0168751 A1* | 6/2015 | Lee | | G02F 1/13624 349/41 |
| 2015/0236042 A1* | 8/2015 | Peng | | G02F 1/13439 257/72 |
| 2015/0243791 A1* | 8/2015 | Itoh | | H01L 27/3265 257/43 |
| 2015/0293546 A1* | 10/2015 | Tanaka | | H03K 17/04206 327/541 |
| 2015/0302808 A1 | 10/2015 | Wang et al. | | |
| 2015/0309360 A1* | 10/2015 | Wang | | G02F 1/133512 345/694 |
| 2015/0331518 A1* | 11/2015 | Kaneko | | G02F 1/133514 345/174 |
| 2015/0362809 A1* | 12/2015 | Wang | | G02F 1/136286 257/532 |
| 2015/0380434 A1* | 12/2015 | Cheng | | H01L 27/124 257/72 |
| 2015/0380435 A1* | 12/2015 | Li | | G02F 1/1368 349/43 |
| 2016/0005767 A1* | 1/2016 | Shen | | H01L 27/1259 257/72 |
| 2016/0026046 A1* | 1/2016 | Itoh | | G02F 1/136286 257/43 |
| 2016/0035294 A1* | 2/2016 | Kim | | B41J 15/18 345/96 |
| 2016/0035751 A1* | 2/2016 | Tsai | | G02F 1/136286 257/59 |
| 2016/0048046 A1* | 2/2016 | Kim | | H01L 27/1255 349/46 |
| 2016/0195782 A1 | 7/2016 | Araki et al. | | |
| 2016/0210924 A1* | 7/2016 | Yao | | G09G 3/3607 |
| 2016/0259460 A1* | 9/2016 | Yang | | G02F 1/136286 |
| 2016/0274715 A1* | 9/2016 | Wang | | G06F 3/0412 |
| 2016/0300891 A1* | 10/2016 | Ren | | H01L 27/3213 |
| 2016/0320675 A1* | 11/2016 | Lee | | G02F 1/1368 |
| 2016/0327838 A1* | 11/2016 | Li | | H01L 23/60 |
| 2016/0342008 A1* | 11/2016 | Lee | | G02F 1/13624 |
| 2016/0357073 A1* | 12/2016 | Zhang | | G02F 1/136286 |
| 2017/0110042 A1* | 4/2017 | Liao | | G09G 3/2003 |
| 2017/0139285 A1* | 5/2017 | Lee | | G02F 1/134336 |
| 2017/0168332 A1* | 6/2017 | Jeon | | H01L 29/0847 |
| 2017/0185193 A1* | 6/2017 | Kim | | G02F 1/136286 |
| 2018/0012907 A1* | 1/2018 | Cheng | | H01L 27/124 |
| 2018/0033383 A1* | 2/2018 | Kim | | G09G 3/3607 |
| 2018/0246385 A1* | 8/2018 | Um | | H01L 27/1259 |
| 2018/0267370 A1* | 9/2018 | Chu | | G02F 1/134309 |
| 2018/0331125 A1* | 11/2018 | Wang | | G09G 3/20 |
| 2018/0373102 A1* | 12/2018 | Chai | | G02F 1/136286 |
| 2019/0088681 A1* | 3/2019 | Mu | | G02F 1/136286 |
| 2020/0027899 A1* | 1/2020 | Chen | | H01L 27/1248 |
| 2020/0041851 A1* | 2/2020 | Qi | | G02F 1/134309 |

FOREIGN PATENT DOCUMENTS

| | | |
|---|---|---|
| CN | 103424916 A | 12/2013 |
| CN | 203930287 U | 11/2014 |
| WO | WO-2016107098 A1 * 7/2016 | G06F 3/041 |

OTHER PUBLICATIONS

International Search Report of PCT/CN2017/109130 in Chinese, dated Jan. 26, 2018 with English translation.
Notice of Transmittal of the International Search Report of PCT/CN2017/109130 in Chinese, dated Jan. 26, 2018.
Written Opinion of the International Searching Authority of PCT/CN2017/109130 in Chinese, dated Jan. 26, 2018 with English translation.

* cited by examiner

ARRAY SUBSTRATE, DISPLAY PANEL AND DISPLAY DEVICE

CROSS REFERENCE TO RELATED APPLICATIONS

This application is the National Stage of PCT/CN2017/109130 filed on Nov. 2, 2017, which claims priority under 35 U.S.C. § 119 of Chinese Application No. 201710170493.7 filed on Mar. 21, 2017, the disclosure of which is incorporated by reference.

TECHNICAL FIELD

Embodiments of the present disclosure relate to an array substrate, a display panel and a display device.

BACKGROUND

Liquid crystal display (LCD) device has been highly favored by customers for its characteristic of low power consumption, and is applicable for various types of electronic apparatuses. The LCD device displays an image mainly based on the principle of controlling a transmittance of light, through liquid crystal (LC), by utilizing an electric field. In a case that the LCD device is in a full black display mode, light leakage may occur at both sides of a data line and a gate line, because LC molecules at both sides of the data line and the gate line are subjected to an influence from an electric signal transmitted via the data line and the gate line and hence are improperly rotated. In order to reduce the above-mentioned light leakage, a black matrix is required to be disposed above both of the data line and the gate line. However, the black matrix as disposed can reduce an aperture ratio of the LCD device.

SUMMARY

An embodiment of the present disclosure provides an array substrate. The array substrate includes a pixel unit, and the pixel unit includes: a first data line and a second data line which extend along a first direction and are adjacent to each other; a first gate line and a second gate line which extend substantially along a second direction intersected with the first direction and are adjacent to each other; and at least two sub-pixels which are sequentially arranged in parallel along the first direction substantially; in which the first gate line and the second gate line are disposed at two sides of the at least two sub-pixels in the first direction, respectively.

For example, in an array substrate provided by an embodiment of the present disclosure, a number of the at least two sub-pixels is three, and the first gate line and the second gate line are disposed at two sides of the three sub-pixels in the first direction, respectively.

For example, in an array substrate provided by an embodiment of the present disclosure, the three sub-pixels include a first sub-pixel adjacent to the first gate line, a third sub-pixel adjacent to the second gate line, and a second sub-pixel located between the first sub-pixel and the third sub-pixel; the first sub-pixel is electrically connected to the first gate line and the first data line; the third sub-pixel is electrically connected to the second gate line and the first data line; the second sub-pixel is electrically connected to the first gate line and the second data line or is electrically connected to the second gate line and the second data line.

For example, in an array substrate provided by an embodiment of the present disclosure, each of the sub-pixels includes a thin film transistor (TFT) connected to a data line and a gate line which are configured to drive the each of the sub-pixels.

For example, in an array substrate provided by an embodiment of the present disclosure, the first data line and the second data line are disposed at two sides of the three sub-pixels in the second direction, respectively.

For example, in an array substrate provided by an embodiment of the present disclosure, the pixel unit is repeatedly arranged in the first direction and the second direction.

For example, in an array substrate provided by an embodiment of the present disclosure, two pixel units that are adjacent in the second direction and are respectively located at two sides of one second data line share the one second data line.

For example, in an array substrate provided by an embodiment of the present disclosure, the three sub-pixels are a red sub-pixel unit, a green sub-pixel unit and a blue sub-pixel unit, respectively.

For example, in an array substrate provided by an embodiment of the present disclosure, the second direction is perpendicular to the first direction.

For example, in an array substrate provided by an embodiment of the present disclosure, each of the sub-pixels includes a driving electrode. The driving electrode includes: a plurality of first driving sub-electrodes, which extend along the second direction and arranged to be spaced apart from each other along the first direction, and at least one second driving sub-pixel which extends along the first direction and is configured to electrically connect the plurality of first driving sub-electrodes; in which an electric field formed between at least part of the second driving sub-electrode and at least one of the first data line and the second data line is parallel to a rubbing alignment direction, and the rubbing alignment direction is parallel to the second direction.

For example, in an array substrate provided by an embodiment of the present disclosure, the first driving sub-electrode includes a first electrode portion and a second electrode portion which extend along different directions; the first electrode portion and the second electrode portion are intersected with the rubbing alignment direction, respectively.

For example, in an array substrate provided by an embodiment of the present disclosure, it further includes a gate line shielding layer, and the gate line shielding layer is disposed above at least one of the first gate line and the second gate line.

For example, in an array substrate provided by an embodiment of the present disclosure, a portion of the at least one of the first gate line and the second gate line corresponding to the first electrode portion is parallel to the first electrode portion, and a portion of the at least one of the first gate line and the second gate line corresponding to the second electrode portion is parallel to the second electrode portion.

For example, in an array substrate provided by an embodiment of the present disclosure, it further includes a common electrode line; the common electrode line is non-transparent and is disposed between adjacent two of the sub-pixels.

For example, in an array substrate provided by an embodiment of the present disclosure, a portion of the common electrode line corresponding to the first electrode portion is parallel to the first electrode portion, and a portion of the common electrode line corresponding to the second electrode portion is parallel to the second electrode portion.

Another embodiment of the present disclosure provides a display panel, and the display panel includes the above-mentioned array substrate.

Yet another embodiment of the present disclosure provides a display device, and the display device includes the above-mentioned array substrate or display panel.

Further another embodiment of the present disclosure provides an array substrate, the array substrate is covered with an alignment layer, and the array substrate includes: a data line extending substantially along a first direction; a first gate line and a second gate line which extend substantially along a second direction intersected with the first direction and are adjacent to each other; and a pixel unit defined by the data line, the first gate line and the second gate line; each pixel unit includes at least two sub-pixels which are sequentially arranged in parallel along the first direction; the first gate line and the second gate line are disposed at two sides of the at least two sub-pixels in the first direction, respectively. Each of the sub-pixels includes a driving electrode, and each driving electrode includes: a plurality of first driving sub-electrodes which extend along the second direction and are arranged to be spaced apart from each other along the first direction; an alignment direction of the alignment layer is parallel to the second direction.

For example, in an array substrate provided by further another embodiment of the present disclosure, the driving electrode further includes at least one second driving sub-pixel which extends along the first direction and is configured to electrically connect the plurality of first driving sub-electrodes; an electric field formed between at least part of the second driving sub-electrode and the data line is parallel to a rubbing alignment direction.

For example, in an array substrate provided by further another embodiment of the present disclosure, each first driving sub-electrode includes a first electrode portion and a second electrode portion, the first electrode portion and the second electrode portion extend along different directions and are intersected with the rubbing alignment direction, respectively.

For example, in an array substrate provided by yet another embodiment of the present disclosure, it further includes a gate line shielding layer, and the gate line shielding layer is disposed above at least one of the first gate line and the second gate line.

For example, in an array substrate provided by yet another embodiment of the present disclosure, a portion of the at least one of the first gate line and the second gate line corresponding to the first electrode portion is parallel to the first electrode portion, and a portion of the at least one of the first gate line and the second gate line corresponding to the second electrode portion is parallel to the second electrode portion, respectively.

For example, in an array substrate provided by yet another embodiment of the present disclosure, it further includes a common electrode line; the common electrode line is non-transparent and is disposed between adjacent two of the sub-pixels.

For example, in an array substrate provided by yet another embodiment of the present disclosure, a portion of the common electrode line corresponding to the first electrode portion is parallel to the first electrode portion, and a portion of the common electrode line corresponding to the second electrode portion is parallel to the second electrode portion, respectively.

For example, in an array substrate provided by yet another embodiment of the present disclosure, the second direction is perpendicular to the first direction.

For example, in an array substrate provided by yet another embodiment of the present disclosure, the first gate line and the second gate line are disposed at two sides of two sub-pixels in the first direction, respectively; the two sub-pixels include a first sub-pixel adjacent to the first gate line and a second sub-pixel adjacent to the second gate line; the first sub-pixel is electrically connected to the first gate line and a data line located at left side of the first sub-pixel; the second sub-pixel is electrically connected to the second gate line and a data line located at right side of the second sub-pixel.

For example, in an array substrate provided by yet another embodiment of the present disclosure, each of the sub-pixels further includes a thin film transistor (TFT) connected to a data line and a gate line which are configured to drive the each of the sub-pixels.

For example, in an array substrate provided by yet another embodiment of the present disclosure, one data line is disposed between two sub-pixels which are adjacent in the second direction.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have same one meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left"

and the like are only used to indicate relative position relationship, and when the position of the object which is described is changed, the relative position relationship may be changed accordingly.

Embodiments of the present disclosure provide an array substrate, a display panel and a display device, which achieve an improvement in aperture ratio.

At least one embodiment of the present disclosure provides an array substrate. The array substrate includes: a first data line and a second data line which extend substantially along a first direction and are adjacent to each other; a first gate line and a second gate line which extend substantially along a second direction intersected with the first direction and are adjacent to each other; and at least two sub-pixels which are sequentially arranged in parallel along the first direction; in which the first gate line and the second gate line are disposed at two sides of the at least two sub-pixels in the first direction, respectively. For example, the embodiments of the present disclosure are described in detail with reference to the case where three sub-pixels are sequentially arranged in parallel along the first direction by way of example without limiting the present disclosure thereto.

Figure 1:
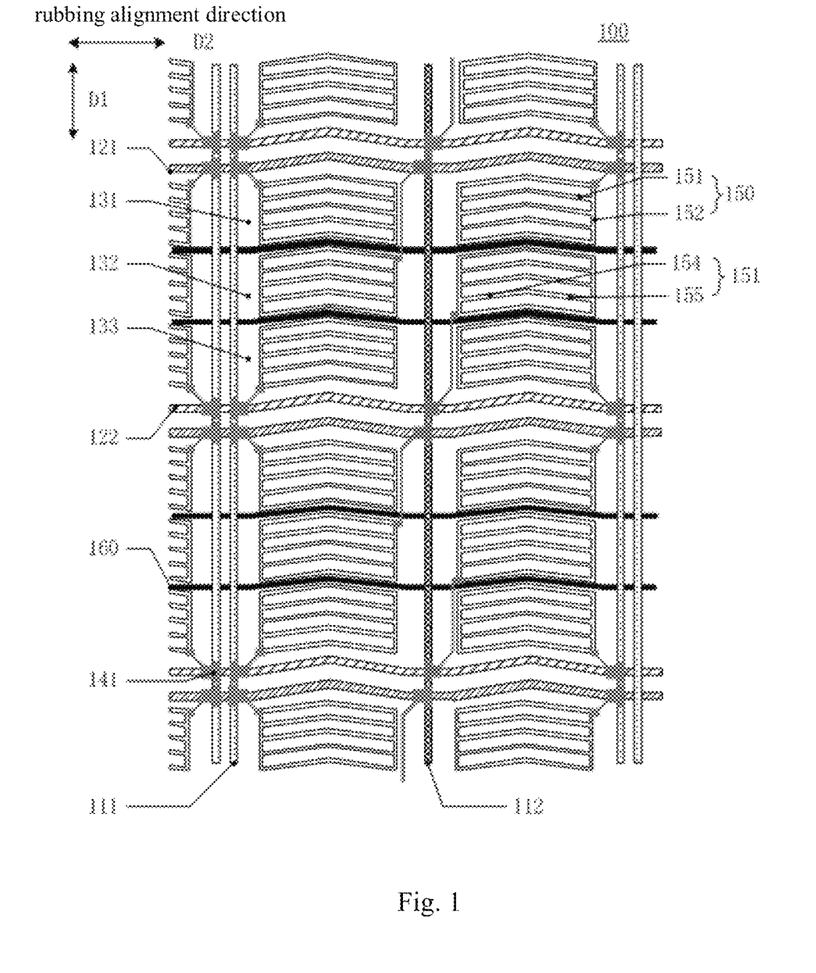
FIG. 1 is a plan view illustrating an array substrate provided by an embodiment of the present disclosure.

For example, FIG. 1 illustrates a plan view of an array substrate 100 provided by an embodiment of the present disclosure. For example, as illustrated in FIG. 1, the array substrate 100 can include a plurality of pixel units arranged in an array. Each of the pixel units can include a first data line 111 and a second data line 112 which extend substantially along a first direction D1 and are adjacent to each other; a first gate line 121 and a second gate line 122 which extend substantially along a second direction D2 intersected with the first direction D1 and are adjacent to each other; and three sub-pixels which are sequentially arranged in parallel along the first direction D1.

It should be understood that, the first data line 111 and the second data line 112 extending substantially along the first direction D1 merely defines an extending direction of the first data line 111 and the second data line 112, which does not indicate that the first data line 111 and the second data line 112 have to parallel to the first direction D1; in other words, according to actual demands, the first data line 111 and the second data line 112 can be parallel to the first direction D1, or part of the first data line 111 and the second data line 112 can be not parallel to the first direction D1. For example, an extending direction of the first data line 111 can be parallel to the first direction D1. For another example, in order to improve the aperture ratio of the array substrate 100 in a better way, partial region of the second data line 112 can be bended.

It should be understood that, the first gate line 121 and the second gate line 122 extending substantially along the second direction D2 does not mean that the first gate line 121 and the second gate line 122 have to parallel to the second direction D2, either. For example, in order to suppress LC disclination and to improve LC efficiency of a display panel including the array substrate 100, part of the first gate line 121 and the second gate line 122 can be bended. For example, the LC efficiency of the display panel is T/T1, in which T is a transmittance of the display panel when an included angle between optical axes of an upper polarizer and a lower polarizer is 90°, and T1 is a transmittance of the display panel when the included angle between optical axes of the upper polarizer and the lower polarizer is 0°.

For example, the second direction D2 can be perpendicular to the first direction D1. For example, the first direction D1 can be a column direction (a vertical direction in the figure) of the array substrate 100, the second direction D2 can be a row direction (a horizontal direction of the figure) of the array substrate 100. For example, the first gate line 121 and the second gate line 122 can be disposed at two sides of the three sub-pixels in the first direction D1, respectively; the first data line 111 and the second data line 112 can be disposed at two sides of the three sub-pixels in the second direction D2, respectively.

For example, the three sub-pixels sequentially disposed in parallel along the first direction D1 can include a first sub-pixel 131 adjacent to the first gate line 121, a third sub-pixel 133 adjacent to the second gate line 122, and a second sub-pixel 132 located between the first sub-pixel 131 and the third sub-pixel 133. The first sub-pixel 131 can be electrically connected to the first gate line 121 and the first data line 111 (i.e., the sub-pixel operates according to a signal provided by the gate line and the data line); the third sub-pixel 133 can be electrically connected to the second gate line 122 and the first data line 111; and the second sub-pixel 132 can be electrically connected to the first gate line 121 and the second data line 112 or electrically connected to the second gate line 122 and the second data line 112. For example, each of the sub-pixels can include a thin film transistor (TFT) 141 used as a switching element. The TFT 141 can be connected to a gate line and a data line which are configured to drive the each of the sub-pixels. For example, a gate electrode of the TFT is electrically connected to a gate line, a source electrode of the TFT is electrically connected to a data line, and a drain electrode of the TFT is electrically connected to a pixel electrode of the each of the sub-pixels.

For example, the three sub-pixels can be a red sub-pixel unit, a green sub-pixel unit and a blue sub-pixel unit, respectively. In such a case, three sub-pixels in a region defined by the first gate line 121, the second gate line 122, the first data line 111 and the second data line 112 can form a pixel unit.

For example, in the array substrate 100 provided by an embodiment of the present disclosure, through allowing three sub-pixels to be disposed in the region defined by the first gate line 121, the second gate line 122, the first data line 111 and the second data line 112, the data lines, which extend along the first direction D1 and corresponding to every six sub-pixels sandwiched between the first gate line 121 and the second gate line 122 (that is, the sub-pixels, which are located between the first gate line 121 and the second gate line 122, of two columns of sub-pixels) can be blocked by only two columns of black matrixes (the black matrix for shielding the data line at the left side and the right side respectively can set to be ½ column because three sub-pixels among the above-mentioned six sub-pixels that are disposed at left/right side share one column of black matrix for shielding data line with three sub-pixels disposed at left/right side of the three sub-pixels among the above-mentioned six sub-pixels). For example, the six sub-pixels refer to two columns of sub-pixels, which are located between the first gate line 121 and the second gate line 122, and the first column of the sub-pixels and the first column of the sub-pixels share the second data line 112. For a conventional array substrate with a dual-gate structure, every six sub-pixels (that is, the sub-pixels, which are located between the first gate line 121 and the second gate line 122, of three columns of sub-pixels) sandwiched between the first gate line 121 and the second gate line 122 have to use three columns of black matrixes to shield the data line extending along the first direction D1 (the black matrix for shielding the data line at the left side and the right side respectively can set to be ½ column because three sub-pixels among the above-mentioned six sub-pixels that are disposed at left/right side share one column of black matrix for shielding data line with three sub-pixels disposed at left/right side of the three sub-pixels among the above-mentioned six sub-pixels). In this way, the array substrate 100 provided by an embodiment of the present disclosure can reduce the number of columns of the black matrixes need to be disposed, so as to correspondingly improve the aperture ratio of the array substrate 100.

For example, each of the sub-pixels can include a driving electrode 150. For example, the driving electrode 150 can be a pixel electrode or a common electrode, and is configured to work together with another electrode (which is a common electrode or a pixel electrode correspondingly) to generate an electric field for driving LC molecules to rotate. For example, the driving electrode 150 illustrated in FIG. 1 is a pixel electrode. For example, each driving electrode 150 can include: a plurality of first driving sub-electrodes 151 which extend along the second direction D2 and are arranged to be spaced apart from each other along the first direction D1; and at least one second driving sub-electrode 152 which extends along the first direction D1 and is configured to electrically connect the plurality of first driving sub-electrodes 151. For example, the second driving sub-electrode 152 can be disposed in such a manner that an electric field formed between at least part of the second driving sub-electrode 152 and at least one of the first data line 111 and the second data line 112 is parallel to a rubbing alignment direction of an alignment layer disposed on the array substrate.

For example, FIG. 1 illustrates that each driving electrode 150 includes five first driving sub-electrodes 151 by way of example, but the embodiments of the present disclosure are not limited thereto. For example, each driving electrode 150 also can include nine first driving sub-electrodes 151.

For example, all the first driving sub-electrodes 151 as illustrated in FIG. 1 have same one length along the second direction D2, but the embodiments of the present disclosure are not limited thereto. For example, for a driving electrode 150 of the first sub-pixel 131, a length along the second direction D2 of two first driving sub-electrodes 151 closer to the first gate line 121 can be smaller than a length of other first driving sub-pixel(s) 151 along the second direction D2. For another example, for a driving electrode 150 of the third sub-pixel 133, a length along the second direction D2 of two first driving sub-electrodes 151 closer to the second gate line 122 can be smaller than a length of other first driving sub-pixel(s) 151 along the second direction D2.

For example, FIG. 1 illustrates that each driving electrode 150 includes two second driving sub-electrodes 152 by way of example, but the embodiments of the present disclosure are not limited thereto. For example, according to actual demands, each driving electrode 150 also can include one or four second driving sub-electrode(s) 152.

For example, each of the second driving sub-electrodes 152 in FIG. 1 is an electrode strip parallel to the first direction D1, but the embodiments of the present disclosure are not limited thereto. For example, in the case that not all the first driving sub-electrodes 151 have same one length along the second direction D2, the second driving sub-electrode 152 can be bended. For example, the second driving sub-electrode can include: two electrode strips parallel to the first direction D1; and one electrode strip which is used for connecting the above-mentioned two electrode strips and is parallel to a corresponding portion of the first driving sub-electrode 151. For example, the three electrode strips above can be integrally formed by a patterning process.

For example, the second data line 112 as illustrated in FIG. 1 is parallel to the first direction D1, but the embodiments of the present disclosure are not limited thereto. For example, in order to reduce the distance in the second direction D2 between the sub-pixels respectively disposed at two sides of the second data line 112, a portion of the second data line 112 located between the first gate line 121 and the second gate line 122 can include an upper portion and a lower portion which are parallel to the first direction D1, and a connecting portion for connecting the upper portion and the lower portion; moreover, in the second direction D2, the lower portion is closer to a sub-pixel disposed at left side of the second data line 112.

For example, a rubbing alignment direction of the array substrate 100 can be parallel to the second direction D2, and because the second driving sub-electrode 152 and the second data line 112 illustrated in FIG. 1 both are parallel to the first direction D1, an electric field formed between the second driving sub-electrode 152 and each of the first data line 111 and the second data line 112 is parallel to the rubbing alignment direction; as a result, it can suppress improper rotation of LC molecules and light leakage, which are caused by a voltage transmitted in the data line, at both sides of the data line, and can reduce the width in the second direction D2 of the black matrix for shielding the data line, and hence to further improve the aperture ratio of the array substrate 100.

For example, each first driving sub-electrode 151 can include a first electrode portion 154 and a second electrode portion 155 having extending directions which are different from each other and are intersected with the rubbing alignment direction respectively. For example, an included angle between the first electrode part 154 and the second direction D2, and an included angle between the second electrode part 155 and the second direction D2, can have an absolute value of 7°, but the embodiments of the present disclosure are not limited thereto. As a result, in a display panel including the array substrate 100 provided by an embodiment of the present disclosure, LC molecules between adjacent two sub-pixels (e.g., between the first sub-pixel and the second sub-pixel) would not involve disclination, this can improve the LC efficiency of the display panel including the array substrate 100. For example, the LC efficiency of the display panel is T/T1, in which T is a transmittance of the display panel when an included angle between optical axes of an upper polarizer and a lower polarizer is 90°, and T1 is a transmittance of the display panel when the included angle between optical axes of the upper polarizer and the lower polarizer is 0°.

For example, a portion of at least one of the first gate line 121 and the second gate line 122 corresponding to the first electrode portion 154 and a portion of at least one of the first gate line 121 and the second gate line 122 corresponding to the second electrode portion 155 can be respectively disposed in a manner of being parallel to the first electrode portion 154 and the second electrode portion 155. In this way, LC molecules between the driving electrode 150 of the sub-pixel and at least one of the first gate line 121 and the second gate line 122 would not involve disclination, this can further improve the LC efficiency of the display panel including the array substrate 100.

For example, the array substrate 100 can further include a gate line shielding layer (not illustrated in FIG. 1). For example, the gate line shielding layer can be disposed above at least one of the first gate line 121 and the second gate line 122 (e.g., at least disposed at a location above a portion, which is corresponding to the first driving sub-electrode 151, of at least one of the first gate line 121 and the second gate line 122). For example, a voltage on the gate line shielding layer can be zero, and thus the gate line shielding layer can be configured to be capable of reducing an intensity of the electric field formed between the first driving sub-electrode 151 and at least one of the first gate line 121 and the second gate line 122; as a result, the gate line shielding layer can suppress improper rotation of LC molecules and the light leakage, which are caused by a voltage transmitted in at least one of the first gate line 121 and the second gate line 122, at two sides of the at least one of the first gate line 121 and the second gate line 122, and can reduce the width in the first direction D1 of a black matrix for shielding at least one of the first gate line 121 and the second gate line 122, and hence to further improve the aperture ratio of the array substrate 100.

For example, a width, a material and a shape of the gate line shielding layer can be configured according to actual demands, and no specific limitations are given to the embodiments of the present disclosure in this aspect. For example, the width of the gate line shielding layer in the first direction can be larger than a sum of a width of the first gate line 121 and a width of the second gate line 122 in the first direction, so as to reduce the intensity of the electric field formed between the first driving sub-electrode 151 and at least one of the first gate line 121 and the second gate line 122 in a better way. For example, the intensity of the electric field formed between the first driving sub-electrode 151 and at least one of the first gate line 121 and the second gate line 122 can be reduced to zero. For example, in order to reduce the number of masks used in manufacturing the array substrate 100, the gate line shielding layer can be formed in same one layer with the pixel electrode, and in such a case, the material of the gate line shielding layer can be a transparent conductive material, but the embodiments of the present disclosure are not limited thereto. For example, a portion of the gate line shielding layer corresponding to the first electrode portion 154 can be parallel to the first electrode portion 154, and a portion of the gate line shielding layer corresponding to the second electrode portion 155 can be parallel to the second electrode portion 155; in this way, the LC molecules between the driving electrode 150 of the sub-pixel and the gate line shielding layer would not involve disclination, this can further improve the LC efficiency of the display panel including the array substrate 100.

For example, the array substrate 100 can further include a common electrode line 160 which is non-transparent and is disposed between adjacent two sub-pixels. In this way, it can reduce an influence, caused by light emitted from a sub-pixel, to an adjacent sub-pixel. For example, in the case that the light emitted from sub-pixels that are adjacent in the first direction D1 have different colors, it can avoid an issue of color blending.

For example, a portion of the common electrode line 160 corresponding to the first electrode portion 154 can be parallel to the first electrode portion 154, and a portion of the common electrode line 160 corresponding to the second electrode portion 155 can be parallel to the second electrode portion 155; in this way, LC molecules between the driving electrode 150 of the sub-pixel and the common electrode line 160 would not involve disclination, this can further improve the LC efficiency of the display panel including the array substrate 100.

For example, one second data line 112 or two first data lines 111 can be disposed between sub-pixels adjacent in the second direction D2. For example, one first gate line 121 and one second gate line 122 can be disposed between pixel units (that is, three sub-pixels disposed in parallel in the first direction D1) adjacent in the first direction D1.

At least one embodiment of the present disclosure provides a display panel including the array substrate described above. At least one embodiment of the present disclosure provides a display device including the display panel or the array substrate described above.

Figure 2:
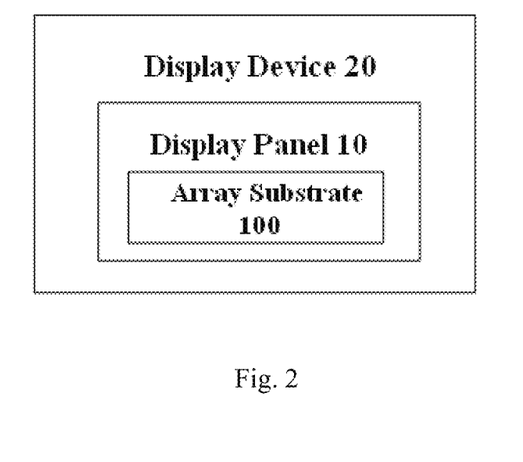
FIG. 2 is an exemplary block diagram illustrating a display panel provided by another embodiment of the present disclosure and a display device provided by yet another embodiment of the present disclosure.

For example, FIG. 2 is an exemplary block diagram illustrating a display panel provided by another embodiment of the present disclosure and a display device provided by yet another embodiment of the present disclosure.

For example, as illustrated in FIG. 2, the display panel 10 can include an array substrate 100. It should be understood that, for other indispensible components (e.g., opposed substrate, a LC layer and the like) for the display panel 10, conventional components can be adopted, which should be appreciated by those skilled art in the art, no further descriptions will be given herein and it shall not be constructed as limitations to the embodiments of the present disclosure. The display panel 10 achieves an improvement in the aperture ratio.

For example, as illustrated in FIG. 2, the display device 20 can include the display panel 10 or the array substrate 100 described above. It should be understood that, other indispensible components (e.g., a controlling device, an image data encoding/decoding device, a row scanning driver, a column scanning driver, a clock circuit and the like) for the display device 20 are also included in the display device, which should be appreciated by those skilled art in the art, no further descriptions will be given herein and it shall not be constructed as limitations to the embodiments of the present disclosure. The display device 20 achieves an improvement in the aperture ratio.

At least one embodiment of the present disclosure further provides an array substrate, the array substrate is covered with an alignment layer (e.g., a polyimide layer) and the array substrate includes: a data line extending substantially along a first direction; a first gate line and a second gate line which extend substantially along a second direction intersected with the first direction and are adjacent to each other; and a pixel unit defined by the data line, the first gate line and the second gate line. Each pixel unit includes at least two sub-pixels which are sequentially arranged in parallel along the first direction; the first gate line and the second gate line are disposed at two sides of the at least two sub-pixels in the first direction, respectively. Each of the sub-pixels includes a driving electrode, and each driving electrode includes: a plurality of first driving sub-electrodes which extend along the second direction and are arranged to be spaced apart from each other along the first direction. An alignment direction of the alignment layer is parallel to the second direction. The alignment layer can be rubbed by a brush or the like so as to form superfine recesses on a surface of the alignment layer; in such case, the alignment direction of the alignment layer is the rubbing direction. Alternatively, an optical alignment method can also be adopted for the alignment layer so that the surface of the alignment layer possesses an alignment effect along a certain direction, and hence has an alignment direction.

Figure 3:
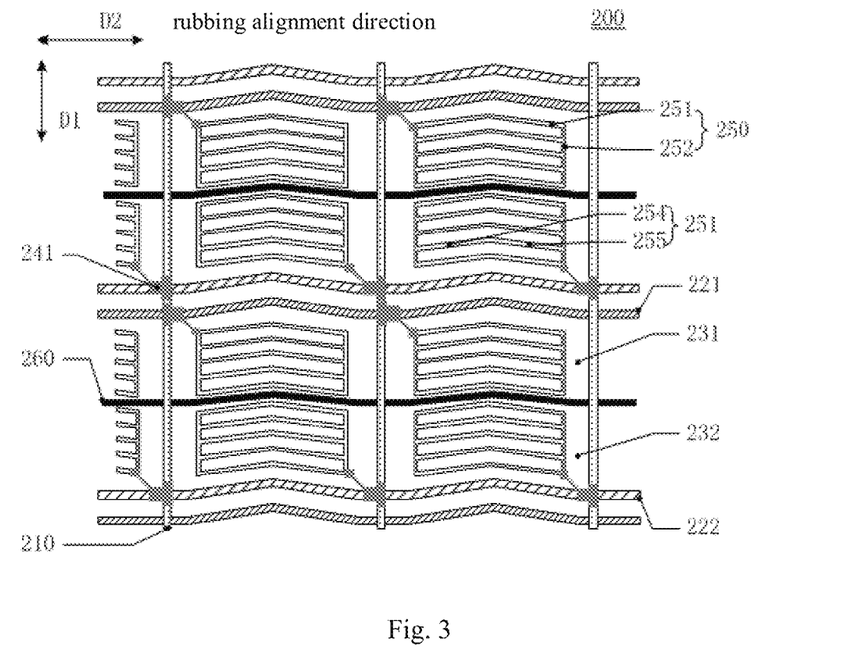
FIG. 3 is a plan view illustrating another array substrate provided by further another embodiment of the present disclosure.

For example, FIG. 3 is a plan view illustrating another array substrate 200 provided by further another embodiment of the present disclosure. For example, as illustrated in FIG. 3, the array substrate 200 is covered with an alignment layer (not illustrated in FIG. 3), and the array substrate 200 includes a data line 210 extending substantially along a first direction D1; a first gate line 221 and a second gate line 222 which extend substantially along a second direction D2 intersected with the first direction D1 and are adjacent to each other; and a pixel unit defined by the data line 210, the first gate line 221 and the second gate line 222; each pixel unit includes two sub-pixels sequentially arranged to be spaced apart from each other along the first direction D1.

It should be understood that, the first gate line 221 and the second gate line 222 extending substantially along the second direction D2 does not mean that the first gate line 221 and the second gate line 222 have to parallel to the second direction D2. For example, in order to suppress LC disclination and to improve a LC efficiency of a display panel including the array substrate 200, partial region of the first gate line 221 and the second gate line 222 can be designed in a form of bending. For example, the LC efficiency of the display panel is T/T1, in which T is a transmittance of the display panel when an included angle between optical axes of an upper polarizer and a lower polarizer is 90°, and T1 is a transmittance of the display panel when the included angle between optical axes of the upper polarizer and the lower polarizer is 0°.

For example, the second direction D2 can be perpendicular to the first direction D1. For example, the first direction D1 can be a column direction of the array substrate 200, the second direction D2 can be a row direction of the array substrate 200. For example, the first gate line 221 and the second gate line 222 can be disposed at two sides of the two sub-pixels in the first direction D1, respectively. For example, one data line 210 can be disposed between two sub-pixels adjacent in the second direction D2. For example, the two sub-pixels sequentially arranged in parallel along the first direction D1 include a first sub-pixel 231 adjacent to the first gate line 221, and a second sub-pixel 232 adjacent to the second gate line 222; the first sub-pixel 231 is electrically connected to the first gate line 221 and a data line 210 located at left side of the first sub-pixel 231; the second sub-pixel 232 is electrically connected to the second gate line 222 and a data line 210 located at right side of the second sub-pixel 232. For example, each of the sub-pixels can include a TFT 241, and the TFT 241 can be electrically connected to a gate line and a data line 210 which are configured to drive the each of the sub-pixels.

For example, each of the sub-pixels includes a driving electrode 250. For example, the driving electrode 250 can be a pixel electrode or a common electrode, and can be cooperated with another electrode (which is a common electrode or a pixel electrode correspondingly) to generate an electric field for driving LC molecules to rotate. For example, the driving electrode 250 illustrated in FIG. 3 is a pixel electrode. For example, each driving electrode 250 can include a plurality of first driving sub-electrodes 251 which extend along the second direction D2 and is arranged to be spaced apart from each other along the first direction D1. For example, FIG. 3 illustrates that each driving electrode 250 includes five first driving sub-electrodes 251 by way of example, but the embodiments of the present disclosure are not limited thereto. For example, each driving electrode 250 also can include nine first driving sub-electrodes 251.

For example, all the first driving sub-electrodes 251 as illustrated in FIG. 3 have same one length along the second direction D2, but the embodiments of the present disclosure are not limited thereto. For example, for a driving electrode 250 of the first sub-pixel 231, a length along the second direction D2 of two first driving sub-electrodes 251 closer to the first gate line 221 can be smaller than a length of other first driving sub-pixel(s) 251 along the second direction D2. For another example, for a driving electrode 250 of the second sub-pixel 232, a length along the second direction D2 of two first driving sub-electrodes 251 closer to the second gate line 222 can be smaller than a length of other first driving sub-pixel(s) 251 along the second direction D2.

For example, each driving electrode 250 can further include at least one second driving sub-electrode 252 extending along the first direction D1, the at least one second driving sub-electrode 252 can be configured to electrically connect the plurality of first driving sub-electrodes 251. For example, the second driving sub-electrode 252 can be disposed in such a manner that an electric field formed between at least part of the second driving sub-electrode 252 and the data line 210 is parallel to the alignment direction of the alignment layer disposed on the array substrate.

For example, the alignment direction of the alignment layer can be parallel to the second direction D2, and because the second driving sub-electrode 252 and the data line 210 as illustrated in FIG. 3 both are parallel to the first direction D1, an electric field formed between the second driving sub-electrode 252 and the data line 210 is parallel to the alignment direction of the alignment layer; as a result, it can suppress improper rotation of LC molecules and light leakage at both sides of the data line 210 caused by a voltage transmitted in the data line 210, and can reduce the width in the second direction D2 of a black matrix for shielding the data line 210, and hence to improve the aperture ratio of the array substrate 200.

For example, each first driving sub-electrode 251 can include a first electrode portion 254 and a second electrode portion 255 having extending directions which are different from each other and are respectively intersected with the rubbing alignment direction. As a result, in a display panel including the array substrate 200 provided by an embodiment of the present disclosure, LC molecules between adjacent two sub-pixels would not involve disclination, and the LC efficiency and a transmittance under an all-white display mode of the display panel including the array substrate 200 are improved.

For example, a portion of at least one of the first gate line 221 and the second gate line 222 corresponding to the first electrode portion 254 and a portion of the at least one of the first gate line 221 and the second gate line 222 corresponding to the second electrode portion 255 can be disposed in a manner of being parallel to the first electrode portion 254 and the second electrode portion 255, respectively. In this way, LC molecules between the driving electrode 250 of the sub-pixel and the at least one of the first gate line 221 and the second gate line 222 would not involve disclination, this can further improve the LC efficiency of the display panel including the array substrate 200.

For example, the array substrate 200 can further include a gate line shielding layer. For example, the gate line shielding layer can be disposed above the at least one of the first gate line and the second gate line. For example, the gate line shielding layer can be disposed at least at a location above a portion, which is corresponding to the first driving sub-electrode 251, of the at least one of the first gate line and the second gate line. For example, a voltage on the gate line shielding layer can be zero, and thus the gate line shielding layer can be configured to be capable of reducing an intensity of an electric field formed between the first driving sub-electrode 251 and the at least one of the first gate line 221 and the second gate line 222. In this way, it can suppress improper rotation of LC molecules and the light leakage at both sides of a gate line (at least one of the first gate line 221 and the second gate line 222) caused by a voltage transmitted in the gate line, and can reduce the width in the first direction D1 of a black matrix for shielding the gate line, and hence to further improve the aperture ratio of the array substrate 200.

For example, a width, a material and a shape of the gate line shielding layer can be configured according to actual demands, and no specific limitations are given to the embodiments of the present disclosure. For example, the width of the gate line shielding layer in the first direction can be larger than a sum of a width of the first gate line 221 and a width of the second gate line 222 in the first direction, so as to further reduce the intensity of the electric field formed between the first driving sub-electrode 251 and the at least one of the first gate line 221 and the second gate line 222. For example, the intensity of the electric field formed between the first driving sub-electrode 251 and the at least one of the first gate line 221 and the second gate line 222 can be reduced to zero. For example, in order to reduce the number of masks used in manufacturing the array substrate 200, the gate line shielding layer can be formed in same one layer with the pixel electrode, and in such a case, the material of the gate line shielding layer can be a transparent conductive material, but the embodiments of the present disclosure are not limited thereto. For example, a portion of the gate line shielding layer corresponding to the first electrode portion 254 and a portion of the gate line shielding layer corresponding to the second electrode portion 255 can be parallel to the first electrode portion 254 and the second electrode portion 255, respectively; in this way, the LC molecules between the driving electrode 250 of the sub-pixel and the gate line shielding layer would not involve disclination, this can further improve the LC efficiency of the display panel including the array substrate 200.

For example, the array substrate 200 can further include a common electrode line 260 which is non-transparent and is disposed between adjacent two sub-pixels. In this way, it can reduce an influence, caused by light emitted from a sub-pixel, to an adjacent sub-pixel. For example, in the case that the light emitted from sub-pixels that are adjacent in the first direction D1 have different colors, it can avoid an issue of color blending.

For example, a portion of the common electrode line 260 corresponding to the first electrode portion 254 and a portion of the common electrode line 260 corresponding to the second electrode portion 255 can be parallel to the first electrode portion 254 and the second electrode portion 255, respectively; in this way, LC molecules between the driving electrode 250 of the sub-pixel and the common electrode line 260 would not involve disclination, this can further improve the LC efficiency of the display panel including the array substrate 200.

For the array substrate in the embodiment illustrated in FIG. 1, the alignment layer coated thereon has an alignment direction which is also parallel to the second direction, so as to achieve related effect(s).

Embodiments of the present disclosure provide an array substrate, a display panel and a display device, which achieve an improvement in aperture ratio.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

The application claims priority of Chinese patent application No. 201710170493.7 filed with the SIPO on Mar. 21, 2017, the entire disclosure of which is incorporated herein by reference as part of the present application.

What is claimed is:

1. An array substrate, comprising a pixel unit, wherein the pixel unit comprises:
    a first data line and a second data line that extend substantially along a first direction;
    a first gate line and a second gate line that extend substantially along a second direction, wherein the second direction is intersected with the first direction; and
    three sub-pixels are sequentially arranged in parallel along the first direction;
    wherein the three sub-pixels comprise a first sub-pixel adjacent to the first gate line, a third sub-pixel adjacent to the second gate line, and a second sub-pixel located between the first sub-pixel and the second sub-pixel,
    the first sub-pixel is electrically connected to the first gate line and the first data line,
    the third sub-pixel is electrically connected to the second gate line and the first data line, and
    the second sub-pixel is electrically connected to the first gate line and the second data line, or is electrically connected to the second gate line and the second data line.

2. The array substrate according to claim 1, wherein each of the sub-pixels comprises a thin film transistor (TFT) connected to one of the first data line and the second data line, and to one of the first gate line and the second gate line, which are configured to drive the each of the sub-pixels.

3. The array substrate according to claim 1, wherein the three sub-pixels are disposed between the first data line and the second data line in the second direction.

4. The array substrate according to claim 1, wherein the pixel unit is repeatedly arranged in the first direction and the second direction.

5. The array substrate according to claim 4, wherein two pixel units that are adjacent in the second direction and are located at two sides of one second data line share the one second data line.

6. The array substrate according to claim 1, wherein the three sub-pixels are a red sub-pixel unit, a green sub-pixel unit and a blue sub-pixel unit.

7. The array substrate according to claim 1, wherein the second direction is perpendicular to the first direction.

8. The array substrate according to claim 7, wherein
    each of the sub-pixels comprises a driving electrode, and the driving electrode comprises:
        a plurality of first driving sub-electrodes which extend along the second direction and are arranged to be spaced apart from each other along the first direction; and
        at least one second driving sub-electrode which extends along the first direction and is configured to electrically connect the plurality of first driving sub-electrodes;
    at least part of the second driving sub-electrode is further configured to form an electric field with at least one of the first data line and the second data line, the electric field being parallel to a rubbing alignment direction, and the rubbing alignment direction being parallel to the second direction.

9. The array substrate according to claim 8, wherein the first driving sub-electrode comprises a first electrode portion and a second electrode portion which extend along different directions, and the first electrode portion and the second electrode portion are intersected with the rubbing alignment direction.

10. The array substrate according to claim 9, wherein a portion of the at least one of the first gate line and the second gate line corresponding to the first electrode portion is parallel to the first electrode portion, and a portion of the at least one of the first gate line and the second gate line corresponding to the second electrode portion is parallel to the second electrode portion.

11. The array substrate according to claim 9, further comprising a common electrode line, wherein the common electrode line is non-transparent and is disposed between adjacent two of the sub-pixels.

12. The array substrate according to claim 11, wherein a portion of the common electrode line corresponding to the first electrode portion is parallel to the first electrode portion, and a portion of the common electrode line corresponding to the second electrode portion is parallel to the second electrode portion.

13. A display panel, comprising the array substrate according to claim 1.

14. A display device, comprising the array substrate according to claim 1.

* * * * *